United States Patent
Kawaji et al.

(10) Patent No.: US 10,444,414 B2
(45) Date of Patent: Oct. 15, 2019

(54) SILVER REFLECTOR, AND MANUFACTURE METHOD AND EXAMINATION METHOD THEREFOR

(71) Applicant: Konica Minolta, Inc., Tokyo (JP)

(72) Inventors: Munenori Kawaji, Tokyo (JP); Shingo Nakamura, Hachioji (JP); Tomokazu Taguchi, Osaka (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/747,175

(22) PCT Filed: Jul. 25, 2016

(86) PCT No.: PCT/JP2016/071784
§ 371 (c)(1),
(2) Date: Jan. 24, 2018

(87) PCT Pub. No.: WO2017/018393
PCT Pub. Date: Feb. 2, 2017

(65) Prior Publication Data
US 2018/0217303 A1    Aug. 2, 2018

(30) Foreign Application Priority Data
Jul. 27, 2015 (JP) ................ 2015-148151

(51) Int. Cl.
*G02B 5/08* (2006.01)
*C23C 14/06* (2006.01)
(Continued)

(52) U.S. Cl.
CPC ........ *G02B 5/0808* (2013.01); *C23C 14/0021* (2013.01); *C23C 14/06* (2013.01);
(Continued)

(58) Field of Classification Search
CPC ........... G01L 1/00; G02B 5/0808; G02B 5/08; G01M 11/005
(Continued)

(56) References Cited

U.S. PATENT DOCUMENTS 6,906,863 B2 * 6/2005 Yoshida ............... F21S 41/37
359/584
8,498,047 B2 * 7/2013 Ishihara ............... G02B 5/0858
359/360

(Continued)

FOREIGN PATENT DOCUMENTS

JP  2006133331 A  5/2006
JP  2009116263 A  5/2009

(Continued)

OTHER PUBLICATIONS

International Search Report dated Aug. 30, 2016 for PCT/JP2016/071784.

(Continued)

*Primary Examiner* — Octavia Hollington
(74) *Attorney, Agent, or Firm* — Lucas & Mercanti, LLP

(57) ABSTRACT

Provided is a silver reflector capable of maintaining a high reflectivity achieved by using silver even under a hot and humid environment, wherein a film stress can be suppressed and a face deformation of an optical surface can be reduced, and a manufacture method therefor. A film stress after a reflection film is formed is within a range of +100 MPa to −100 MPa, and a film stress after the reflection film is subjected to a hot and dry environment at 110° C. for 24 hours and a film stress after the reflection film subjected to the environment is subjected to a hot and humid environment at 85° C. and 85% RH for 24 hours are within a range (Continued)

of +100 MPa to −100 MPa, and also an absolute value of a change amount between the former and latter film stress values is 40 MPa or lower.

16 Claims, 4 Drawing Sheets

(51) Int. Cl.
    *C23C 14/08*     (2006.01)
    *C23C 14/48*     (2006.01)
    *C23C 14/00*     (2006.01)
    *C23C 14/10*     (2006.01)
    *C23C 14/20*     (2006.01)
    *C23C 14/22*     (2006.01)
    *C23C 14/30*     (2006.01)
    *C23C 14/18*     (2006.01)
    *G01M 11/00*     (2006.01)

(52) U.S. Cl.
    CPC ............ *C23C 14/08* (2013.01); *C23C 14/081* (2013.01); *C23C 14/083* (2013.01); *C23C 14/10* (2013.01); *C23C 14/18* (2013.01); *C23C 14/20* (2013.01); *C23C 14/221* (2013.01); *C23C 14/225* (2013.01); *C23C 14/30* (2013.01); *C23C 14/48* (2013.01); *G01M 11/005* (2013.01); *G02B 5/08* (2013.01)

(58) Field of Classification Search
    USPC .......................................................... 73/785
    See application file for complete search history.

(56) References Cited

U.S. PATENT DOCUMENTS 9,759,844 B2 *   9/2017   Adachi ................. B32B 15/08
2003/0147139 A1 *   8/2003   Kandaka ............... B82Y 10/00
                                                                                   359/584

FOREIGN PATENT DOCUMENTS

| JP | 2011221208 A | 11/2011 | |
|----|--------------|---------|---|
| WO | 2005029142 A1 | 3/2005 | |
| WO | WO-2005029142 A1 * | 3/2005 | ........... G02B 5/0858 |

OTHER PUBLICATIONS

International Search Opinion dated Aug. 30, 2016 for PCT/JP2016/071784.

* cited by examiner

SILVER REFLECTOR, AND MANUFACTURE METHOD AND EXAMINATION METHOD THEREFOR

CROSS REFERENCE TO RELATED APPLICATION

This Application is a 371 of PCT/JP2016/071784 filed on Jul. 25, 2016, which, in turn, claimed the priority of Japanese Patent Application No. JP 2015-148151 filed on Jul. 27, 2015, both applications are incorporated herein by reference.

TECHNOLOGICAL FIELD

The present invention relates to a silver reflector, which has durability in use under a hot and humid environment and can suppress deformation of an optical surface due to a film stress, and a manufacture method and an examination method therefor.

BACKGROUND

There are reflectors in which a reflection film containing silver is formed on a substrate (e.g. Patent Literatures 1 to 3). Such a reflector has needs such as suppression of change in a shape of an optical surface, improvement in adhesiveness of the reflection film and improvement in corrosion resistance of the reflection film. Especially for a reflector placed under a severe usage environment like an on-vehicle product, extremely high environmental resistance is required.

Patent Literature 1 describes a light reflector in which a reflection film containing silver is formed on a surface of a plastic substrate, wherein the plastic substrate is a heat curable resin formed article, an adhesiveness-improving film is made of Cr, $Al_2O_3$, $LaTiO_3$ and the like, and a reflection-enhancing layer is made of a multilayer of $Y_2O_3$, $Al_2O_3$ and the like. Here, each film constituting the reflection film is formed by vapor deposition using plasma.

Patent Literature 2 describes a reflector having a structure that a film mainly composed of aluminum oxide is formed directly on both sides of a silver film, wherein both the films mainly composed of aluminum oxide on both sides are made of aluminum oxide or aluminum oxynitride. Here, both the films mainly composed of aluminum oxide are formed by a sputtering method, an ion beam-assisted deposition method, or the like.

Patent Literature 3 describes an optical mirror for laser beam having a substrate layer, a stress-adjusting film formed on the substrate layer to deform the substrate layer into a convex shape, and a reflection film formed on the stress-adjusting film, wherein the stress-adjusting film contains any of zinc sulfide, cerium oxide and silicon oxide. Here, this stress-adjusting film is formed by physical assistance including ion or plasma.

Patent Literature 1 describes resistance of the reflection film to the environment, but a concrete method or quantitative explanation is not given, e.g. it is not specifically described by what configuration and to what extent the high durability can be achieved.

In Patent Literature 2, although the reflectance is improved by a heat treatment at 50 to 200° C., only the change in reflectance at a temperature of 70° C. and a humidity of 90% is measured for the conditions including moisture resistance, and a specific method for improving moisture resistance is not disclosed.

Patent Literature 3 discloses a structure that deformation of the convex surface is suppressed by the stress-adjusting film having a tensile stress which countervails a tensile stress of an Ag film, but it does not disclose durability under a hot environment and a hot and humid environment.

CITATION LIST

Patent Literature

Patent Literature 1: Japanese Patent Laid-Open No. 2006-133331
Patent Literature 2: WO 2005/029142
Patent Literature 3: Japanese Patent Laid-Open No. 2009-116263

SUMMARY

The present invention was made in view of the above background, and the object of the present invention is to provide a silver reflector in which high reflectivity achieved by using silver can be maintained even under a hot and humid environment and face deformation of the optical surface can be reduced with decreasing the film stress.

In addition, another object of the present invention is to provide a manufacture method and an examination method for the silver reflector having high durability and performance.

In order to achieve the above object, a silver reflector according to the present invention is a silver reflector which includes an adhesion layer as a primer layer, a main silver layer formed on the adhesion layer and a reflection-enhancing layer formed on the main silver layer as a reflection film, wherein the main silver layer is formed of either silver or an alloy mainly composed of silver, a film stress of the reflection film after the reflection film is formed is within a range of +100 MPa to −100 MPa, a film stress of the reflection film after the reflection film is subjected to a hot and dry environment at 110° C. for 24 hours is within a range of +100 MPa to −100 MPa, a film stress of the reflection film after the reflection film subjected to the hot and dry environment at 110° C. is subjected to a hot and humid environment at 85° C. and 85% RH for 24 hours is within a range of +100 MPa to −100 MPa, and the absolute value of the change amount between the film stress value of the reflection film after the film is subjected to a hot and dry environment at 110° C. for 24 hours and the film stress value of the reflection film after the film is subjected to a hot and humid environment at 85° C. and 85% RH for 24 hours is 40 MPa or lower. Here, the dry in the hot and dry environment means 20% RH or lower.

According to the above-described silver reflector, not only the film stress after the film formation is within a range of +100 MPa to −100 MPa, but also the film stress after the reflection film is subjected to a hot and dry environment at 110° C. for 24 hours and a film stress after the reflection film subjected to the hot and dry environment at 110° C. is subjected to a hot and humid environment at 85° C. and 85% RH for 24 hours are within a range of +100 MPa to −100 MPa, so that the stress applied to the substrate and the like can be decreased and the face deformation of the optical surface can be reduced. Moreover, since the absolute value of the change amount between the film stress value after the film is subjected to a hot and dry environment at 110° C. for 24 hours and the film stress value after the film is subjected to a hot and humid environment at 85° C. and 85% RH for 24 hours is 40 MPa or lower, it is considered that fluctuation of the film state depending on entering and exiting of water or the like accompanied with change of the fluctuation environment, is suppressed, and shear stress is hardly caused on the interface between the reflection film and the primer layer, and deterioration such as peeling of the reflection film can be prevented and high reflectivity can be maintained even under a hot and humid environment. Specifically, for example, even after a durability test in which the film is preserved under an environment at 85° C. and 85% RH for 1000 hours is carried out, the reflectance is not substantially decreased, and also appearance defects such as crack and film peeling are hardly caused.

In order to achieve the above object, the examination method for the silver reflector according to the present invention is an examination method for the silver reflector which includes the adhesion layer as a primer layer, the main silver layer formed on the adhesion layer and the reflection-enhancing layer formed on the main silver layer as a reflection film, wherein the main silver layer is formed of either silver or an alloy mainly composed of silver, it is judged whether or not the film stress after the reflection film is formed is within a range of +100 MPa to −100 MPa, and also it is judged whether or not the absolute value of the change amount between the film stress value after the reflection film is subjected to a hot and dry environment at 110° C. for 24 hours and the film stress value after the reflection film subjected to the hot and dry environment at 110° C. for 24 hours is subjected to a hot and humid environment at 85° C. and 85% RH for 24 hours is 40 MPa or lower.

According to the examination method, it is judged whether or not the film stress after the film formation is within a range of +100 MPa to −100 MPa, and it can be confirmed whether or not the silver reflector is a silver reflector in which the stress applied to the substrate and the like can be decreased and the face deformation on the optical surface can be suppressed. Furthermore, since it is judged whether or not the absolute value of the change amount between the film stress value after the film is subjected to a hot and dry environment at 110° C. for 24 hours and the film stress value after the film is subjected to a hot and humid environment at 85° C. and 85% RH for 24 hours is 40 MPa or lower, it can be confirmed whether or not the silver reflector is a silver reflector in which deterioration such as peeling of the reflection film due to entering and exiting of water or the like accompanied with change of the fluctuation environment can be prevented to maintain the high reflectivity even under a hot and humid environment.

In order to achieve the above object, the manufacture method for the silver reflector according to the present invention is a manufacture method for the silver reflector which includes the adhesion layer as a primer layer, the main silver layer formed on the adhesion layer and the reflection-enhancing layer formed on the main silver layer as a reflection film, wherein the main silver layer is formed of either silver or an alloy mainly composed of silver, the film stress after the reflection film is formed is within a range of +100 MPa to −100 MPa, and also the absolute value of the change amount between the film stress value after the reflection film is subjected to a hot and dry environment at 110° C. for 24 hours and the film stress value after the reflection film subjected to the hot and dry environment at 110° C. for 24 hours is subjected to a hot and humid environment at 85° C. and 85% RH for 24 hours is 40 MPa or lower.

According to the manufacture method, the film stress after the film formation is within a range of +100 MPa to −100 MPa, and the stress applied to the substrate and the like can be decreased and the face deformation of the optical surface can be suppressed. Furthermore, since the absolute value of the change amount between the film stress value after the film is subjected to a hot and dry environment at 110° C. for 24 hours and the film stress value after the film is subjected to a hot and humid environment at 85° C. and 85% RH for 24 hours is 40 MPa or lower, it is considered that fluctuation of the film state due to entering and exiting of water or the like accompanied with change of the fluctuation environment is suppressed and shear stress is hardly caused on the interface between the reflection film and the primer layer, and deterioration such as peeling of the reflection film can be prevented and high reflectivity can be maintained even under a hot and humid environment.

DETAILED DESCRIPTION OF EMBODIMENTS

Embodiment

A silver reflector according to an embodiment of the present invention, a manufacture method therefor and the like will be described with reference to drawings.

Figure 1:
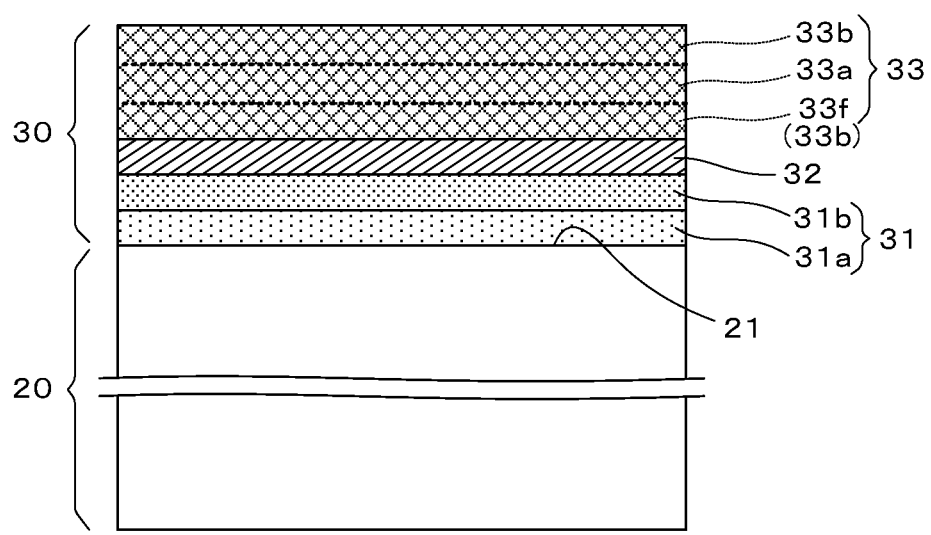
FIG. 1 is an enlarged cross-sectional view illustrating an example of a structure of a silver reflector according to an embodiment.

As shown in FIG. 1, a silver reflector 10 of this embodiment includes a flat plate-like substrate 20 and a reflection film 30 which is a thin film formed on the substrate 20.

The substrate 20 is e.g. a plate-like member and has a flat or curved optical surface 21 covered with the reflection film 30. The substrate 20 needs not have light transmittivity. The substrate 20 is formed of a resin material such as polycarbonate (PC), cycloolefin polymer (COP), acrylic resin (PMMA) and polyethylene terephthalate (PET), but it may be formed of not only the resin materials but also quartz, glass, ceramics or other inorganic materials.

The reflection film 30 includes an adhesion layer 31 formed as a primer layer on the optical surface 21 of the substrate 20, a main silver layer 32 formed on the adhesion layer 31, and a reflection-enhancing layer 33 formed on the main silver layer 32. That is, the main silver layer 32 is sandwiched between the adhesion layer 31 and the reflection-enhancing layer 33.

The adhesion layer 31 is desirably composed of two or more layers. The adhesion layer 31 is composed of two or more layers, so that an effect of blocking water from the substrate 20 can be enhanced. Here, "two or more layers" means a layer of a material having good adhesiveness to the upper main silver layer 32 and a layer of a material having good adhesiveness to the lower substrate 20. When the adhesion layer 31 is composed of a single layer, it is necessary to select a material having good adhesiveness to both the main silver layer 32 and the substrate 20, but in this case, it is not easy to control the film quality and stress. Furthermore, in order to improve the environmental resistance of the main silver layer 32, the influence of water from the substrate 20 must be taken into consideration. In order to suppress the film peeling, crack and the like associated with stress to each film resulting from a hot and humid environment and a hot and dry environment, the film stresses of each film must be adjusted to balance them. In the above situation, when adhesiveness between the materials of the two layers selected from the viewpoint of adhesiveness is insufficient, or when an effect of blocking water is intended to increase, the adhesion layer may be composed of three or more layers. For the adhesion layer 31, several media for blocking water can be exemplified, and it was found that, as one example, a layer mainly composed of aluminum oxide was preferred. The layer mainly composed of aluminum oxide includes a case using not only pure aluminum oxide but also "Substance M2" or "Substance M3" in which about 5 to 10% of $La_2O_3$ is blended in aluminum oxide, manufactured by Merck KGaA. When a layer mainly composed of aluminum oxide used in the adhesion layer 31 was formed without ion assistance, a water-blocking effect was observed, but the tensile stress of the material itself was strong, and it was found that the layer was relatively unsuitable for obtaining durability under a hot and humid environment. Thus, the inventors of this application decided to aim at both the water-blocking effect and the stress-adjusting effect by densifying the film using ion assistance. As a result of various experiments, it was found that the resistance to high temperature and high humidity could be improved by adjusting the film forming conditions such as an output of ion assistance and a film forming rate in consideration of correlation with the film stress of the entire layer. That is, it was found that a layer mainly composed of aluminum oxide formed by an ion-assisted method was preferred as a layer constituting the lower side of the adhesion layer 31. Also, it was found that it was preferred to use $LaTiO_3$, $CeO_2$, $Y_2O_3$ and $SnO_2$ as materials having good adhesiveness to silver for the layer constituting the upper side of the adhesion layer 31. By using these materials, adhesiveness can be enhanced and also stress can be easily adjusted.

The adhesion layer 31 includes at least one layer mainly composed of aluminum oxide, and the layer mainly composed of aluminum oxide is formed by an ion-assisted method. The film stress of the layer mainly composed of aluminum oxide is compressive stress. This allows a slight amount of water to pass through the aluminum oxide layer to enhance the resistance to a hot and humid environment, and to secure a certain degree of denseness and strength by making the stress into the compressive stress.

The specific adhesion layer 31 includes a first layer 31a on a side of the substrate 20 and a second layer 31b on a side of the main silver layer 32. Both layers 31a and 31b have a thickness of about 10 to 200 nm, and more preferably 20 to 100 nm. Here, the first layer 31a is a thin film layer which directly adheres to the substrate 20 and also serves as a buffer layer for somewhat permeating water while blocking water, and the second layer 31b is a thin film layer which directly adheres to the main silver layer 32 and also serves to surely block water. As described above, the first layer 31a on the side of the substrate 20 is a layer mainly composed of aluminum oxide and formed by an ion-assisted method. As described above, the second layer 31b directly adhering to the main silver layer 32 is a layer formed from a material of at least one selected from $LaTiO_3$, $CeO_2$, $Y_2O_3$ and $SnO_2$, and is formed by an ion-assisted method.

Note that, regarding the both layers 31a and 31b, even if the total film thickness is 20 nm or less, they have an effect of improving adhesiveness, but when the film thickness is 20 nm or less, the thin film is still growing, and thus preferably the film thickness is 20 nm or more for exhibiting a sufficient water-blocking effect of the film resulting from continuity. On the other hand, adhesiveness and the water-blocking effect are sufficient also when the film thickness is 100 nm or more, while there are side effects such as increased surface roughness of the substrate 20 and increased influence of the film stress associated with the increased thickness, and thus preferably the film thickness is controlled to be 100 nm or less from the viewpoint of the adhesion layer.

When the adhesion layer 31 includes two or more layers containing at least one adjustment layer related to film stress, a film stress after the one adjustment layer (corresponding to one of the first and second layers 31a and 31b, which will be described in detail later), in a single layer state, is subjected to a hot and humid environment at 85° C. and 85% RH for 24 hours is, by greater compressive force, changed to a negative direction relative to a film stress after the layer is subjected to a hot and dry environment at 110° C. for 24 hours. In this case, in the one adjustment layer, a state allowing some drainage of water can be secured and resistance to a hot and humid environment can be enhanced by means of a material having a relatively low density at which the film stress changes to the negative direction (e.g. aluminum oxide achieved by applying an ion-assisted method and balancing various conditions related to film formation and ion supply in the method). In addition, a film stress after the other adjustment layer (corresponding to the other one of the first and second layers 31a and 31b), in a single layer state, is subjected to a hot and humid environment at 85° C. and 85% RH for 24 hours is changed to a positive direction relative to a film stress after the layer is subjected to a hot and dry environment at 110° C. for 24 hours. In this case, it is determined that, in the other adjustment layer, the density is increased, water can be surely blocked, and the strength of the adjustment layer itself is increased. Note that, the other adjustment layer is desirably combined with a layer having a film stress which changes to the negative direction in order to prevent the film stress from increasing due to the excessively raised density.

The functions of the pair of layers 31a and 31b constituting the adhesion layer 31 will be described in more detail. First, the first layer 31a is formed of a material having a lower density compared to that of the second layer 31b, so that the first layer 31a allows water to permeate to some extent while blocking water. That is, as compared with the second layer 31b, the first layer 31a secures a state of sufficient drainage of water and has a function of preventing peeling as a buffer material for water so as to enhance the resistance of the reflection film 30 to a hot and humid environment. In addition, the first layer 31a is an adjustment layer for balancing the film stress, and has a relatively weak negative film stress. Here, the negative film stress means a state under compressive stress, and also a state of extending in a direction that the film stretches, which corresponds to a state having a relatively high density relative to that of the substrate. Furthermore, as the first layer 31a, in a single layer state, a layer is selected in which a film stress after the layer is subjected to a hot and humid environment at an ambient temperature of 85° C. and a relative humidity of 85% RH for 24 hours is changed to a negative direction relative to a film stress after the layer is subjected to a hot and dry environment at an ambient temperature of 110° C. and a relative humidity of 20% RH or lower (specifically humidity is approximately zero) for 24 hours. It is determined that, in the first layer 31a, the compressive stress is increased by the humidity increasing-type environmental test as described above, and adequate drainage of water or water penetration is ensured. Note that, the first layer 31a is desirably combined with the second layer 31b in which the film stress changes to the positive direction from the viewpoints of adjustment of the film stress and the like.

On the other hand, the second layer 31b is formed of a material having a higher density compared to that of the first layer 31a, so that the second layer 31b secures a state of insufficient drainage of water as compared with the first layer 31a, and can protect the main silver layer 32 so as to enhance the resistance of the reflection film 30 to a hot and humid environment. In addition, the second layer 31b is an adjustment layer for balancing the film stress, and has a negative film stress at a certain level or higher. Furthermore, as the second layer 31b, in a single layer state, a layer is selected in which a film stress after the layer is subjected to a hot and humid environment at an ambient temperature of 85° C. and a relative humidity of 85% RH for 24 hours is changed to a positive direction relative to a film stress after the layer is subjected to a hot and dry environment at an ambient temperature of 110° C. and a relative humidity of 20% RH or lower (specifically humidity is approximately zero) for 24 hours. It is determined that, in the second layer 31b, the compressive stress is somewhat decreased by the humidity increasing-type environmental test as described above, and the water-blocking effect is high.

In this embodiment, the main silver layer 32 is a thin film formed only of silver. The main silver layer 32 has a thickness of about several tens to about 100 nm, and more preferably about 50 to about 100 nm. Note that, when the metal corrosion resistance of the main silver layer 32 is intended to be further enhanced, the main silver layer 32 may be formed of an alloy mainly composed of silver as long as its reflectance is not decreased. Examples of the additive material of the silver alloy include Bi, Pd, Cu, Au, Ge, Nd, Al and the like, for example.

In the reflection-enhancing layer 33, a material of a first layer 33f which directly contacts the main silver layer 32, is mainly composed of aluminum oxide. This is because there has been a possibility that when a layer having a high refractive index is placed on the first layer, reflectivity is lowered in the multilayer film design for enhancing the reflectance of the main silver layer 32. Aluminum oxide is desirable for an optical design with a material having a relatively low refractive index (low-refractive index material in a broad sense), and has relatively good adhesiveness to the main silver layer 32. Materials such as $LaTiO_3$, $CeO_2$, $Y_2O_3$ and $SnO_2$ used in the adhesion layer 31 have a high refractive index of 1.8 or higher, which is inappropriate as a first layer in light of the thin film design. As a result of examination from the viewpoint of adhesiveness and stress adjustment, it was found that various requirements were met by a layer containing aluminum oxide. Also, it was found that the layer laminated on the first layer 33f had no quality problem as long as it was composed of two or more layers using a high-refractive index material and a low-refractive index material in light of the design for enhancing reflection.

The reflection-enhancing layer 33 includes at least three layers. The specific reflection-enhancing layer 33 is a dielectric multilayer film in which a high-refractive index material layer 33a and a low-refractive index material layer 33b are alternately laminated on the lowermost first layer 33f, and the uppermost layer is formed of the low-refractive index material layer 33b. Note that, the first layer 33f in contact with the main silver layer 32 can also be regarded as a medium-refractive index material layer from the viewpoint that its refractive index is higher than that of the uppermost low-refractive index material layer 33b, but in a broad sense, it is referred to as a low-refractive index material layer relative to the high-refractive index material layer 33a. The high-refractive index material layer 33a has a refractive index of 1.8 or higher, the low-refractive index material layer 33b has a refractive index of 1.55 or lower, and the first layer 33f has a refractive index of 1.55 to less than 1.80. The material of the low-refractive index material layer 33b is at least one selected from $SiO_2$ and a mixed material prepared by mixing $SiO_2$ with aluminum oxide. The material of the high-refractive index material layer 33a is at least one selected from $TiO_2$, $Nb_2O_5$, $Ta_2O_5$, $LaTiO_3$, $ZrO_2$ and a mixed material of these materials. Note that the first layer 33f is formed of a material mainly composed of aluminum oxide as described above.

For the high-refractive index material layer 33a and the low-refractive index material layer 33b, film thicknesses corresponding to their refractive indices are set for each layer according to the optical design, and even if the layer 33a and the layer 33b are made of materials having the same refractive indices, their thicknesses may be different. In addition, when the reflection-enhancing layer 33 is composed of a plurality of high-refractive index material layers 33a and a plurality of low-refractive index material layers 33b, for example the plurality of high-refractive index material layers 33a can be formed of different materials having refractive indices different from each other. Furthermore, the single low-refractive index material layer 33b can be composed of plural kinds of low-refractive index material layers, and similarly, the single high-refractive index material layer 33a can also be composed of plural kinds of high-refractive index material layers.

Note that, similarly to the adhesion layer 31, the reflection-enhancing layer 33 may include at least one adjustment layer. That is, the first layer 33f constituting the reflection-enhancing layer 33 and the high-refractive index material layer 33a thereon can be an adjustment layer for balancing the film stress. For example, similarly to the first layer 31a of the adhesion layer 31, the first layer 33f adjacent to the main silver layer 32 can be an adjustment layer having a relatively weak negative film stress. In addition, the first layer 33f, in a single layer state, can be a layer in which a film stress after the layer is subjected to a hot and humid environment at an ambient temperature of 85° C. and a relative humidity of 85% RH for 24 hours is changed to a negative direction relative to a film stress after the layer is subjected to a hot and dry environment at an ambient temperature of 110° C. and a relative humidity of 20% RH or lower (specifically humidity is approximately zero) for 24 hours. In addition, similarly to the second layer 31b of the adhesion layer 31, the high-refractive index material layer 33a on the first layer 33f can be an adjustment layer having a negative film stress at a certain level or higher. As the high-refractive index material layer 33a, in a single layer state, a layer is selected in which a film stress after the layer is subjected to a hot and humid environment at an ambient temperature of 85° C. and a relative humidity of 85% RH for 24 hours is changed to a positive direction relative to a film stress after the layer is subjected to a hot and dry environment at an ambient temperature of 110° C. and a relative humidity of 20% RH or lower (specifically humidity is approximately zero) for 24 hours.

In addition, the film stress of the whole reflection-enhancing layer 33 is preferably more than −50 MPa in the negative direction from the viewpoint of prevention of cracks or the like under a hot environment. In this case, tolerance of the reflection-enhancing layer 33 for the expansion and contraction of the substrate 20 is increased, and it is possible to prevent possibility of cracks under a hot and dry environment for a long time.

Figure 2:
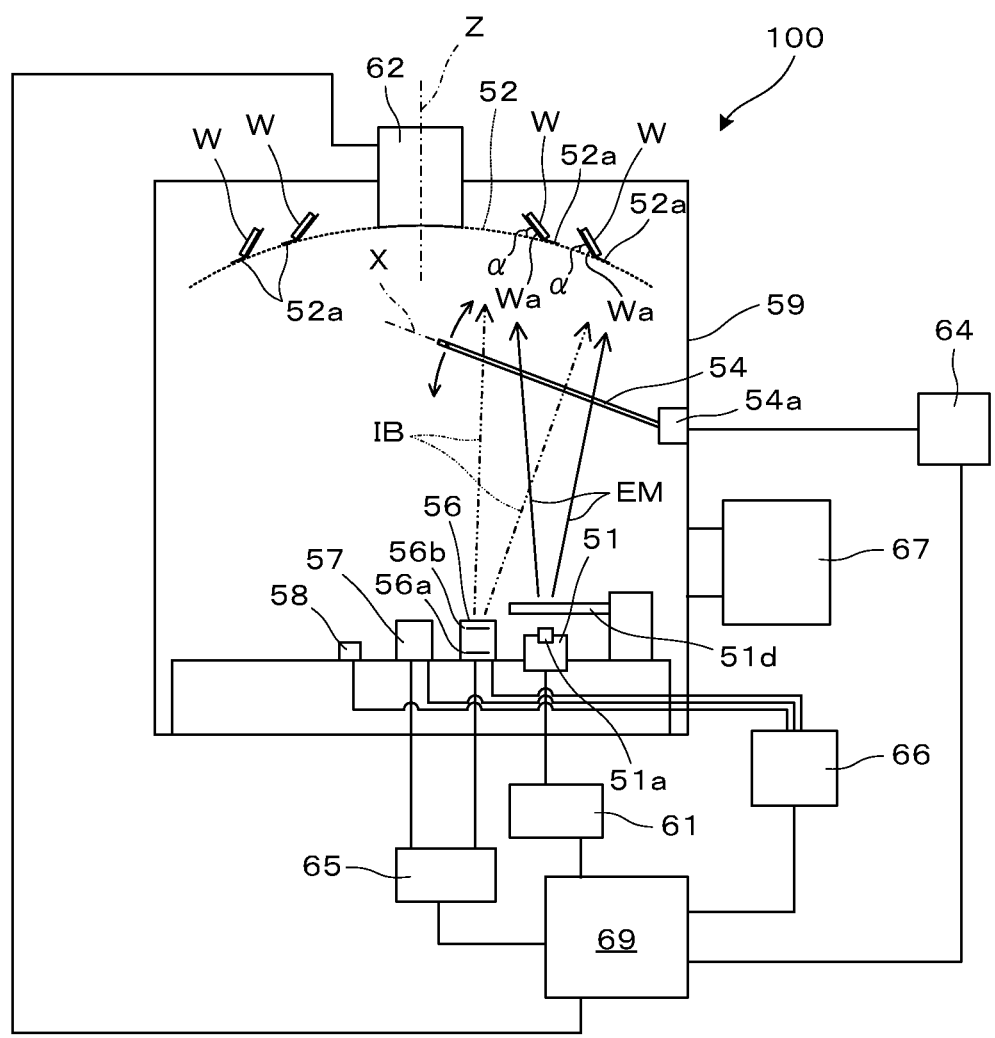
FIG. 2 is a schematic cross-sectional view illustrating an example of a film-forming apparatus used for manufacturing the silver reflector shown in FIG. 1.

Hereinafter, a film-forming apparatus for preparing an elemental film constituting the reflection film 30 on a surface of a workpiece W corresponding to the substrate 20 or the like shown in FIG. 1 will be explained with reference to FIG. 2.

An illustrated film-forming apparatus 100 includes a vapor deposition source 51 as a source for the film-forming material, a vapor deposition holder 52 for supporting and rotating a plurality of workpieces W, a film thickness-correcting plate 54 for adjusting the film thickness in a warp direction of the vapor deposition holder 52, an ion gun 56 for irradiating the workpieces W with an ion beam during film formation, and a neutralization gun 57 for neutralizing ions, in a vacuum container 59. In addition, the film-forming apparatus 100 includes a vapor deposition source-driving section 61 for controlling the operation of the vapor deposition source 51, a holder-driving section 62 for rotationally driving the vapor deposition holder 52, a correction plate-driving section 64 for adjusting a posture or the like of the film thickness-correcting plate 54, an ion gun-driving section 65 for operating the ion gun 56 and the like, a gas-supplying section 66 for supplying gas to the ion gun 56 and the like, a gas outlet 67 for depressurizing the inside of a vacuum container 59, and a control section 69 for controlling the operation of each section constituting the film-forming apparatus 100, outside of the vacuum container 59.

The vapor deposition source 51 enables vacuum deposition of various film-forming materials, and is fixed on a stage at the bottom of the vacuum container 59. The vapor deposition source 51 has a container (not shown) for holding an evaporated substance, and an evaporated substance 51a in the container is heated by an electron gun or resistance heating. From the vapor deposition source 51, vapor EM of the evaporated substance can be emitted upward. The vapor deposition source 51 is operated by the vapor deposition source-driving section 61. The vapor deposition source 51 is accompanied by a shutter 51d, so that a timing of emitting vapor EM can be arbitrarily set. Note that, when the main material for the evaporated substance 51a is silver as in the case of forming the main silver layer 32 using an alloy, the proportion of additives existing in the thin film after the film formation can be adjusted by a heating temperature and the timing of opening and closing the shutter 51d, from the difference in their evaporation temperatures.

The vapor deposition holder 52 is disposed on an upper part facing the vapor deposition source 51 in the vacuum container 59. The vapor deposition holder 52 is in a dome shape or a conical shape as a whole, and holds a large number of workpieces W via a large number of support jigs 52a. The vapor deposition holder 52 autorotates on an axis Z by the holder-driving section 62 so that each workpiece W is disposed periodically facing the vapor deposition source 51. On the vapor deposition holder 52, the surface Wa of the workpiece W is tilted relative to the vapor deposition source 51 by only a certain angle α (specifically, 45°). This is a result of considering that an incidence angle of light to the reflection film 30 is the angle α, in the product into which the silver reflector 10 is incorporated.

The film thickness-correcting plate 54 is disposed between the vapor deposition source 51 and the vapor deposition holder 52. The posture of the film thickness-correcting plate 54 in the vacuum container 59 is controlled by the correction plate-driving section 64. The film thickness-correcting plate 54 can be operated from the outside by a machine mechanism 54a and can be appropriately moved up and down so that the inclination of its axis X is increased and decreased, and if necessary, it can be further rotated on the axis X. When the film thickness-correcting plate 54 is moved up and disposed above the vapor deposition source 51, the portion shaded by the film thickness-correcting plate 54 on the support jig 52a is not vapor-deposited, and the difference in the film thicknesses can be adjusted in the warp direction of the vapor deposition holder 52.

The ion gun 56 extracts ions in plasma by applying a voltage or the like, and releases them to the outside of the ion gun 56. Specifically, the ion gun 56 ionizes a gas supplied from the gas-supplying section 66 and applies a beam voltage between an anode 56a and a cathode 56b of the ion gun 56. The ion gun 56 allows the ionized gas (e.g. positive ion) to get close to and pass through the cathode 56b side, and releases the gas as an ion beam IB into the vacuum container 59. The released ion beam IB is irradiated to the surface Wa of the workpiece W supported by the vapor deposition holder 52. Thereby, the surface Wa of the workpiece W is activated, or alternatively the thin film on the surface Wa of the workpiece W is rearranged, so that the thin film on the surface Wa of the workpiece W can be more-strongly adhered and condensed.

In order to irradiate the ion beam IB, the gas to be supplied from the gas-supplying section 66 to the ion gun 56 may be a gas prepared by adding a reactive gas to an inert gas. As the inert gas, various gases of e.g. argon (Ar), nitrogen ($N_2$), helium (He) and the like, and a mixed gas thereof can be used. In addition, e.g. oxygen ($O_2$) or the like can be used as the reactive gas.

The neutralization gun 57 is intended to neutralize the ions in the ion beam IB to suppress the influence of the electric field distribution. To the neutralization gun 57, a gas for ionization is introduced from the gas-supplying section 66, and the introduced gas is ionized. When electrons generated by ionization are released to the vacuum container 59, gas molecules ionized by the ion gun 56 and released to the vapor deposition holder 52 side are neutralized by electrons. Note that, a neutralization grid may be used instead of the neutralization gun 57.

In addition, the gas outlet 67 reduces the pressure in the vacuum container 59, and an oxygen inlet 58 provided on the bottom of the vacuum container 59 supplies oxygen gas and the like into the vacuum container 59. An automatic pressure controller (not shown) is provided between the oxygen inlet 58 and the gas outlet 67 so that oxygen pressure and the like in the vacuum container 59 can be approximately constant in film formation.

The vapor deposition source-driving section 61 operates the vapor deposition source 51 to emit the vapor EM of the evaporated substance upward. The holder-driving section 62 rotates the vapor deposition holder 52 on the central axis Z during the formation of the vapor EM by the vapor deposition source 51. The correction plate-driving section 64 adjusts the rotation and other postures of the film thickness-correcting plate 54 during vapor deposition by the vapor deposition source 51. During formation of the vapor EM by the vapor deposition source 51, the ion gun-driving section 65 operates the ion gun 56 to irradiate the surface Wa of the workpiece W with the ion beam IB, and also operates the neutralization gun 57 to neutralize the periphery of the workpiece W. The control section 69 operates the vapor deposition source 51 via the vapor deposition source-driving section 61 while rotating the vapor deposition holder 52 by the holder-driving section 62, to form a thin film of the evaporated substance on the surface Wa of the workpiece W.

At this time, the control section 69 operates the ion gun 56 and the like via the ion gun-driving section 65 so that the adhesiveness of the thin film of the evaporated substance formed on the surface Wa of the workpiece W to the workpiece W is enhanced, and the thin film of this evaporated substance is condensed.

The above-described film-forming apparatus 100 enables vapor deposition by an ion-assisted method (i.e. ion beam-assisted vapor deposition), and is used mainly for forming films of the first layer 31a and the second layer 31b constituting the adhesion layer 31. The degree of irradiation with the ion beam IB is adjusted so that the denseness or density of the first and second layers 31a and 31b can be adjusted. In addition, the elemental film constituting the reflection-enhancing layer 33 and the main silver layer 32 can also be formed by using the film-forming apparatus 100. In particular, the low-refractive index material layer 33b of the reflection-enhancing layer 33 and the main silver layer 32 can be easily formed by using an ordinary vapor deposition apparatus without using the ion gun 56 or the like. Note that, when plural kinds of elemental films constituting the reflection film 30 are laminated, films can be sequentially formed by a plurality of film-forming apparatuses 100 having different evaporated substance, but in the same film-forming apparatus 100, the films can be sequentially formed while switching the evaporated substance.

Figure 3:
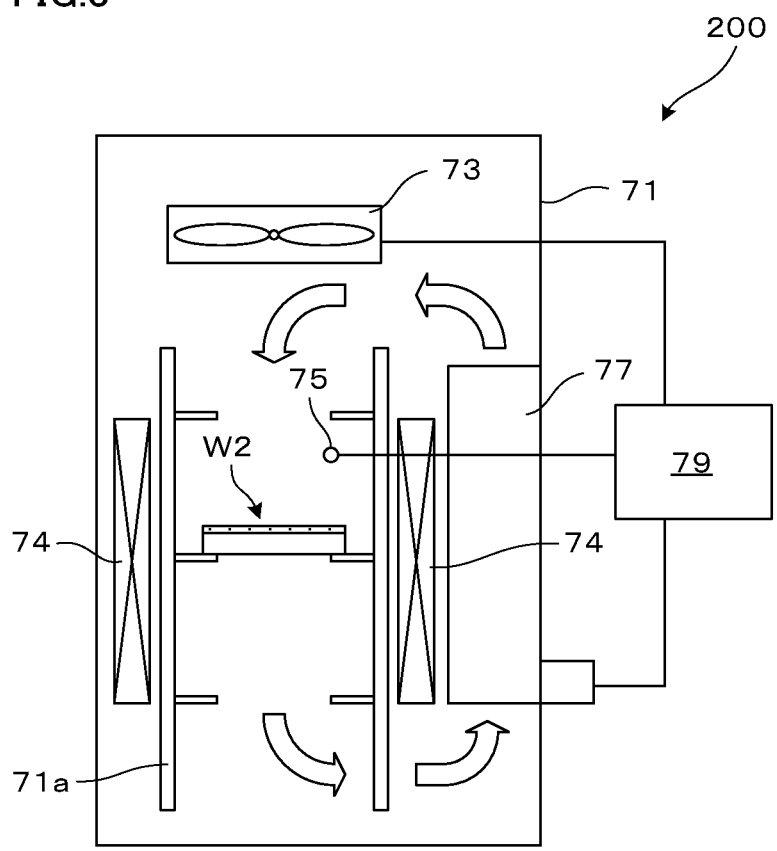
FIG. 3 is a schematic cross-sectional view illustrating an environmental test apparatus used for examining or evaluating the silver reflector in FIG. 1.

Hereinafter, an environmental test apparatus for testing the silver reflector 10 shown in FIG. 1 will be explained with reference to FIG. 3.

An illustrated environmental test apparatus 200 includes a humidity-conditioning chamber 71 having a heat-insulating wall and forming an enclosed space, an air-circulating fan 73, an auxiliary temperature-conditioning section 74 for auxiliary temperature conditioning, a temperature and humidity sensor 75 for measuring a temperature and a humidity in the chamber, an air-conditioning section 77 for constantly maintaining the temperature and humidity in the humidity-conditioning chamber 71, and a control apparatus 79 for controlling them. Note that, a workpiece W2 to be tested by the environmental test apparatus 200 may be the silver reflector 10 as a finished product, or may be a film prepared by forming, as a single layer, the first layer 31a, the second layer 31b or the like constituting the adhesion layer 31 on the substrate 20.

The humidity-conditioning chamber 71 houses the plurality of workpieces W2 while they are supported by shelves 71a. At this time, the temperature and the humidity in the humidity-conditioning chamber 71 are monitored by the temperature and humidity sensor 75 while circulating the atmosphere in the humidity-conditioning chamber 71 by the air-circulating fan 73. The auxiliary temperature-conditioning section 74 additionally heats or cools air around the workpiece W2 on the basis of a detection result of the temperature and humidity sensor 75.

The air-conditioning section 77 temporarily incorporates air in the humidity-conditioning chamber 71, and sends air having a desired temperature and humidity into the humidity-conditioning chamber 71. Changes in properties of the silver reflector 10 and the like under a hot environment or a hot and humid environment can be monitored by the air-conditioning section 77. Specifically, the environments achieved by the air-conditioning section 77 firstly includes a hot and dry environment at an ambient temperature of 110° C. and a humidity of approximately zero, secondly includes a hot and humid environment at an ambient temperature of 85° C. and a relative humidity of 85% RH, and additionally includes a hot and dry environment at an ambient temperature of 85° C. and a humidity of approximately zero. The hot and dry atmosphere or the hot and humid atmosphere formed by the air-conditioning section 77 is uniformed by the air-circulating fan 73 and sent to the periphery of the workpiece W2.

The control apparatus 79 preserves e.g. the workpiece W2 under the first environment (i.e. the hot and dry environment at an ambient temperature of 110° C. and a humidity of approximately zero) for 24 hours and then preserves this workpiece W2 under the second environment (i.e. hot and humid environment at an ambient temperature of 85° C. and a relative humidity of 85% RH) for 24 hours, by appropriately operating the air-conditioning section 77 and the like. In such a way, the manipulation is also referred to as a humidity-increasing-type environmental test, in which the workpiece W2 is preserved under the first environment for 24 hours, and then the environment is switched to the second environment, and it is preserved in the second environment for 24 hours. The control apparatus 79 can also preserve the workpiece W2 in a stable state under the hot and dry environment or the hot and humid environment for a long period e.g. 1000 hours by operating the air-conditioning section 77.

Note that, the temperature of the workpiece W2 can be gradually changed at the start of the first environment or at the end of the second environment. In addition, when switching from the first environment to the subsequent second environment, the environmental test apparatus 200 itself can be changed. Furthermore, when switching from the first environment to the subsequent second environment, a manipulation can also be carried out in which the temperature is temporarily returned to normal temperature to stabilize the state.

In addition, the workpiece W2 to be tested by the illustrated environmental test apparatus 200 may be not only the silver reflector 10 as a product but also a film prepared by forming, as a single layer, a certain reflection layer or constituent layer constituting the reflection film 30 on the substrate 20.

Figure 4:
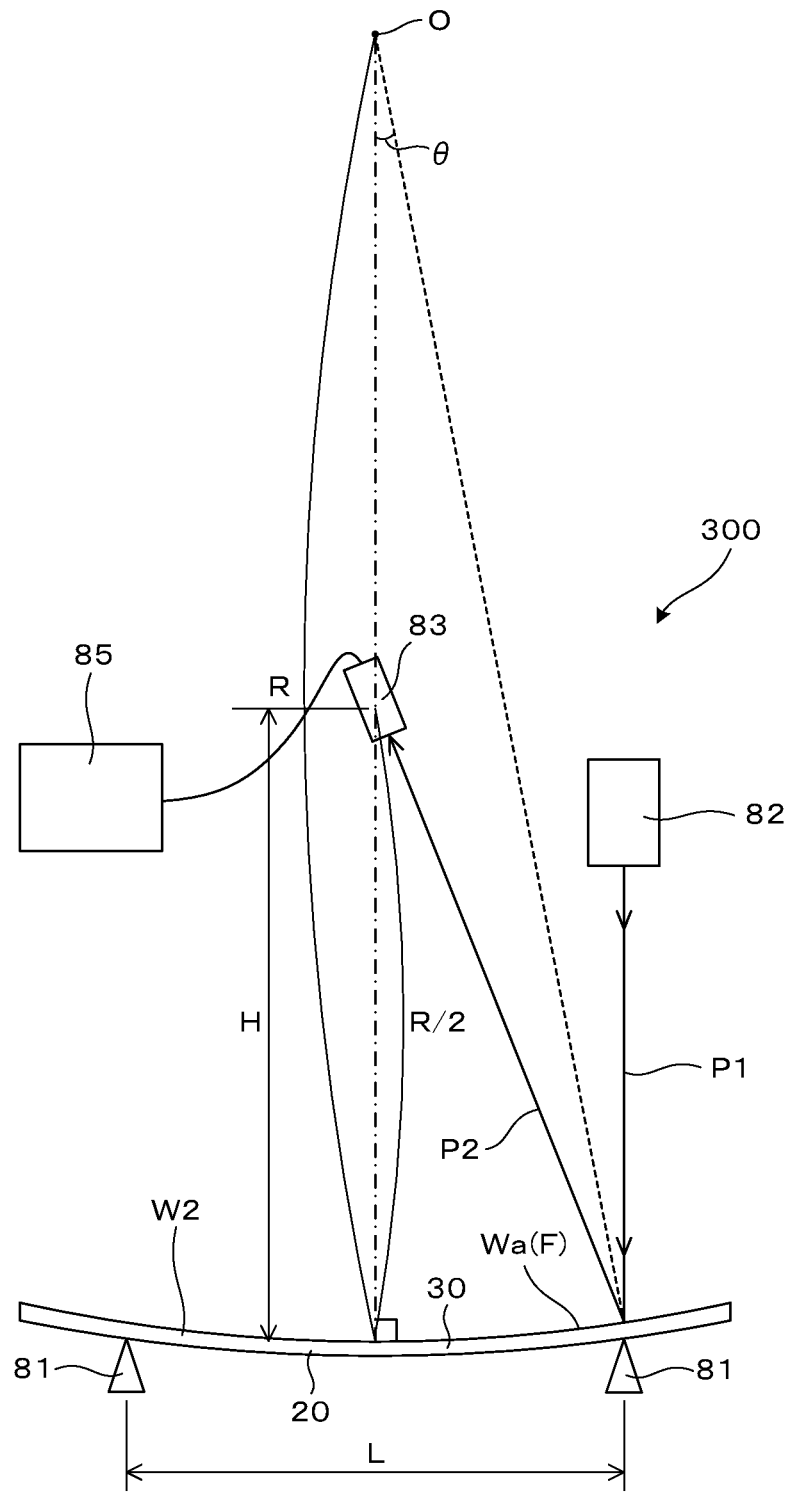
FIG. 4 is a schematic cross-sectional view illustrating a film stress-measuring apparatus used for evaluating the silver reflector in FIG. 1.

Hereinafter, a measurement apparatus for measuring the film stress and the like of the reflection film 30 constituting the silver reflector 10 shown in FIG. 1 will be explained with reference to FIG. 4.

An illustrated stress-measuring apparatus 300 includes a pair of support members 81 for supporting both ends of a strip-like workpiece W2 from the bottom, a laser beam source 82 for irradiating a laser beam P1 on the surface Wa of the workpiece W2 from vertically above, a reflected light sensor 83 for detecting a laser beam P2 reflected by the surface Wa of the workpiece W2, and a control apparatus 85 for controlling the operation of the reflected light sensor 83 and the like.

The pair of support members 81 supports the workpiece W2 at two points separated with a distance of only a length L between them. Here, the apexes of the both support members 81 have the same height, and the workpiece W2 extends in the horizontal direction out of consideration of warp. The laser beam source 82 is disposed vertically above one support member 81 and irradiates the laser beam P1 toward the support member 81 to form a light spot on the surface Wa of the workpiece W2. The reflected light sensor 83 detects the laser beam P2 which is specular light from the light spot on the surface Wa of the workpiece W2. The reflected light sensor 83 has support members and the like not illustrated and can be moved to a height position where the highest level of the laser beam P2 can be detected, and its height H can be measured. Note that, when the workpiece W2 slightly warps in an arc shape, the curvature radius R of the warped workpiece W2 is determined as approximately 2H, and an open angle θ of an incident point of the laser beam P1 relative to an origin O of the curvature of the workpiece W2 is determined as approximately L/4H using the chord length L. The control apparatus 85 calculates the film stress of the thin film formed on the surface Wa of the workpiece W2 on the basis of the open angle θ of the workpiece W2.

For the calculation of the film stress performed in the control apparatus 85, Stoney's equation was used. That is, in the strip-like workpiece W2, when a thickness of the substrate 20 of the workpiece W2 is represented by D and the film thickness of the reflection film F of the workpiece W2 is represented by d, the film thickness d is assumed to be extremely thin, which is represented by D>>d. At this time, the stress 6 of the reflection film F is expressed by the following equation using the curvature radius R of the workpiece W2.

$$\sigma = (Es \times D^2)/[6d(1-v)R]$$

Here, Es represents a Young's modulus of the substrate 20, and v represents Poisson's ratio of the substrate 20.

Here, the relationship between the chord length L and the curvature radius R is represented by R=L/2θ. When the open angle θ is extremely small, approximation 2θ≈2 sin θ is allowed, and thus the stress σ can be approximated to $$\sigma \approx (Es \times D^2)/[6d(1-v)L/(2\sin\theta)].$$

Here, the open angle θ is obtained as a deflection angle of the reflected laser beam P2 as long as the workpiece W2 is recognized to warp in an arc shape, however, for convenience of calculation, a change amount in the stress before and after the film formation of the reflection film F is considered as a film stress, and the film stress can be expressed by the following equation using the difference ΔO between the open angles before and after coating.

$$\sigma \approx (Es \times D^2)/[6d(1-v)L/(2\sin\Delta\theta)]$$

Note that, the workpiece W2 measured by the illustrated stress-measuring apparatus 300 measures the film stress of the reflection film 30 or its constituent in the silver reflector 10 as a product, and needs not have the same shape as that of the silver reflector 10 as the product, and the material of the substrate 20 can also be different from the substrate material for the silver reflector 10 as the product. However, it is likely that when the film stress of the reflection film 30 or its constituent is measured in a situation close to that in the silver reflector 10 as the product, the precision tends to be relatively high.

Hereinafter, the manufacture method and the examination method for the silver reflector 10 shown in FIG. 1 will be described. First, the substrate 20 having the optical surface 21 is prepared, and the first layer 31a and the second layer 31b are sequentially formed on the optical surface 21 by using the film-forming apparatus 100 shown in FIG. 2 to complete the adhesion layer 31. Next, the main silver layer 32 is formed on the adhesion layer 31 by using the same film-forming apparatus 100. Then, the reflection-enhancing layer 33 is formed on the main silver layer 32 by using the same film-forming apparatus 100. Thereby, the silver reflector 10 having the reflection film 30 on the substrate 20 is completed. Note that, a test piece (workpiece W2) for environmental test is also prepared. This test piece is prepared e.g. by forming the reflection film 30 on the strip-like substrate 20 under the same condition. Also, a piece obtained by forming only the first layer 31a which is one of the adhesion layers 31 on the strip-like substrate 20, and a piece obtained by forming only the second layer 31b which is the other one of the adhesion layers 31 on the strip-like substrate 20, are prepared as test pieces. Furthermore, a piece obtained by forming only the reflection-enhancing layer 33 on the strip-like substrate 20 is also prepared as a test piece.

Subsequently, the completed silver reflector 10 or test piece (workpiece W2) is set in the environmental test apparatus 200 and preserved under a hot and dry environment at an ambient temperature of 110° C. and a humidity of approximately zero (first environment) for 24 hours, and then preserved under a hot and humid environment at an ambient temperature of 85° C. and a relative humidity of 85% RH (second environment) for 24 hours. That is, the test piece (workpiece W2) is subjected to a humidity-increasing-type environmental test.

Thereafter, the film stresses of the test piece (workpiece W2) not subjected to the humidity-increasing-type environmental test and the test piece (workpiece W2) subjected to the humidity-increasing-type environmental test are measured. That is, the test piece (workpiece W2) is set in the stress-measuring apparatus 300 to measure the stress of the thin film on the surface of the test piece. When the stress of the thin film on the surface of the test piece meets a predetermined condition, the silver reflector 10 completed under the same conditions as of the test piece is judged to have sufficient resistance to the environment of high temperature, high humidity or the like. Specifically, regarding the test piece (workpiece W2) having the same structure as of the completed silver reflector 10, it is important that the film stress of the reflection film 30 after film formation is within a range of +100 MPa to −100 MPa, and the film stress of the reflection film 30 after preserved under the first environment for 24 hours is within the range of +100 MPa to −100 MPa, as a precondition for securing the quality of the silver reflector 10. Additionally, for the test piece (workpiece W2), it is also judged whether or not the film stress of the reflection film 30 after subjected to the second environment and then subjected to a hot and humid environment at 85° C. and 85% RH for 24 hours is within a range of +100 MPa to −100 MPa. In addition, when a change amount in the film stress value in an absolute value is 40 MPa or lower as a result of preserving the test piece (workpiece W2) having the same structure as of the completed silver reflector 10 under the first environment for 24 hours and then under the second environment for 24 hours, it is judged that deterioration such as peeling of the reflection film 30 can be prevented and a high reflectivity can be maintained even under a hot and humid environment.

Also for the test piece prepared by forming the first layer 31a of the adhesion layer 31 in a single layer state and the test piece prepared by forming the second layer 31b of the adhesion layer 31 in a single layer state among the test pieces (workpieces W2), the stress of the thin film on the surface of the test piece is measured before and after the humidity-increasing-type environmental test in which the test piece is preserved under the first environment for 24 hours and then under the second environment for 24 hours. When a change amount in the film stress value in an absolute value is a negative value (direction of compressive stress) as a result of preserving the lower first layer 31a under the first environment for 24 hours and then under the second environment for 24 hours, it is judged that deterioration such as peeling of the reflection film 30 can be prevented and a high reflectivity can be maintained even under a hot and humid environment. In addition, when a change amount in the film stress value in an absolute value is a positive value (direction of tensile stress) as a result of preserving the upper second layer 31b under the first environment for 24 hours and then under the second environment for 24 hours, it is judged that deterioration such as peeling of the reflection film 30 can be prevented and a high reflectivity can be maintained even under a hot and humid environment.

Additionally, using the environmental test apparatus 200, the completed silver reflector 10 or the test piece (workpiece W2) is subjected to (1) a test of preserving it under a hot and dry environment at an ambient temperature of 110° C. and a humidity of approximately zero (first environment) for 1000 hours, (2) a test of preserving it under a hot and humid environment at an ambient temperature of 85° C. and a relative humidity of 85% RH (second environment) for 1000 hours, and (3) a test of preserving it under a hot and dry environment at an ambient temperature of 85° C. and a humidity of approximately zero (third environment) for 1000 hours. These tests provide information for directly judging the appearance and the durability regarding the optical performance of the silver reflector 10.

EXAMPLES

Hereinafter, specific examples of the silver reflector according to the present invention will be described.

As the film-forming apparatus 100, a model GENER-1300 equipped with an ion gun and the like manufactured by OPTORUN Co., Ltd. was used.

As the material of the substrate 20, Polycarbonate H-3000R manufactured by Mitsubishi Engineering-Plastics Corporation formed into a ⌀30 mm film with a thickness of 3 mm was used as a subject of film formation i.e. the workpiece W.

The substrate 20 was disposed in the state of inclining at 45° to a face perpendicular to the vapor deposition source 51 or to a support face of the vapor deposition holder 52 because the formed surface of the assumed actual product was placed with a deposition incidence angle of 45°.

The film of the adhesion layer in the reflection film was formed by an ion-assisted method in order to further enhance the water-blocking effect and adjust the whole stress for the aluminum oxide layer having good adhesiveness to the substrate and high water-blocking effect. Then the film of $LaTiO_3$ (Substance H4) having good adhesiveness to the main silver layer was formed. Although $LaTiO_3$ (Substance H4) per se has a function of blocking water, the ion-assisted method was used in order to further enhance the blocking effect and adjust the whole stress. The films of aluminum oxide and $LaTiO_3$ (Substance H4) were formed so that their film thicknesses would be 40 to 60 nm from the viewpoint of stress adjustment, but it has been found that the environmental resistance is not significantly influenced even if the thickness is changed for adjusting the whole stress as long as the thickness is within a range of 10 to 200 nm.

Next, the film of the main silver layer was formed on the $LaTiO_3$ (Substance H4) film. In Experimental Examples 1 to 8, films of pure silver were formed. Additionally, in Example 9, a film was formed by using an alloy material prepared by blending 1% of bismuth (Bi) into silver (Ag) (specifically, Ag—Bi material (manufactured by Kobelco Research Institute, Inc.)). Further, in Example 10, a film was formed by using an alloy material prepared by blending 0.25% of bismuth into silver (specifically, Ag—Bi material (manufactured by Kobelco Research Institute, Inc.)). Although the film thickness of the main silver layer was set to 60 nm, there is no problem whether the film is thin or thick as long as the film thickness can secure the reflectance. In addition, although the resistance heating method was used for forming the main silver layer, vapor deposition with an electron gun may be carried out.

Next, the film of the reflection-enhancing layer was formed on the main silver layer. In Examples, two types of designs were performed as design of the multilayer film for stress adjustment. In the first type of design, a structure of three layers in total was constituted, wherein an aluminum oxide layer having a thickness of 120 nm and a refractive index of 1.55 to 1.65 was formed as a low-refractive index material layer on the lower side, next an $LaTiO_3$ (Substance H4) layer having a thickness of 80 nm and a refractive index of 1.8 to 2.2 was formed as a high-refractive index layer, and finally a $SiO_2$ layer having a thickness of 30 nm and a refractive index of 1.42 to 1.5 was formed for the main purpose of excoriation resistance. In the second type of design, a structure of five layers in total was constituted, wherein an aluminum oxide layer having a thickness of 35 nm and a refractive index of 1.55 to 1.65 was formed, next an $LaTiO_3$ (Substance H4) layer having a thickness of 75 nm and a refractive index of 1.8 to 2.2 was formed as a high-refractive index layer, next a $SiO_2$ layer having a thickness of 20 nm and a refractive index of 1.42 to 1.5 was formed, next an $LaTiO_3$ (Substance H4) layer having a thickness of 80 nm was formed, and finally a $SiO_2$ layer having a thickness of 30 nm and a refractive index of 1.42 to 1.5 was formed for the main purpose of excoriation resistance. In both the first and second types of designs, the reflection-enhancing effects were observed, which met a condition that the reflectance for a polarization P with a wavelength of 870 nm and an incidence angle of 45 degrees was 95% or higher.

In order to evaluate the film stress of the silver reflector 10 to be manufactured, not only the ⌀30 mm substrate 20 with a thickness of 3 mm but also a measurement substrate (test piece) for measuring the film stress was prepared. For a measurement substrate, a piece prepared by processing a glass material D263 manufactured by Schott AG into a 50 mm×10 mm thin strip-like glass substrate having a thickness of 0.1 mm was used as a subject for forming a film i.e. the workpiece W. Since stable physical property values of the substrate are required for measuring the film stress from a viewpoint of calculation, a stable glass material insusceptible to external influences of water absorption and the like was used. Similarly to the substrate 20 of the silver reflector 10, the measurement substrate for the film stress was also disposed in the state of inclining at 45° to the face perpendicular to the vapor deposition source 51 or the support face of the vapor deposition holder 52 for film formation.

The following Table 1 summarizes the conditions for film formation.

TABLE 1

Conditions for film formation

| | | Al2O3-A | Al2O3-B | Al2O3-C | Al2O3-D | Al2O3-E | Al2O3-F | H4 | SiO2 | Ag |
|---|---|---|---|---|---|---|---|---|---|---|
| | Method | EB | EB | EB + IAD | EB + IAD | EB + IAD | EB + IAD | EB + IAD | EB | RH |
| | O2-APC(Pa) | 2.00E−02 | 1.50E−02 | 1.20E−02 | 1.20E−02 | 1.20E−02 | 1.20E−02 | 1.20E−02 | Without introduction | Without introduction |
| | rate (Å/sec) | 5 | 5 | 5 | 5 | 5 | 5 | 6.5 | 8 | 25 |
| IAD | Voltage (V) | | | 300 | 400 | 500 | 1000 | 1000 | | |
| | Current (mA) | | | 300 | 400 | 500 | 800 | 800 | | |
| | Acc (V) | | | 400 | 400 | 400 | 600 | 600 | | |
| | O2 (GAS1)(SCCM) | | | 50 | 50 | 50 | 50 | 50 | | |
| | Ar (GAS2)(SCCM) | | | 10 | 10 | 10 | 10 | 10 | | |
| | Ar (GAS3)(SCCM) | | | 8 | 8 | 8 | 8 | 8 | | |

In the above Table 1, the columns "Material condition" mean film materials constituting the reflective film, and the "Al2O3-A" to "Al2O3-F" mean aluminum oxide films having different conditions for film formation. The "H4" means LaTiO$_3$ (Substance H4) manufactured by Merck KGaA, the "SiO$_2$" means a silicon oxide film or a silica film, and the "Ag" means the main silver layer. In the columns "Method", the "EB" means film formation by electron beam deposition, the "EB+IAD" means ion-assisted type electron beam deposition, and the "RH" means film formation by resistance heating. In the columns "O2-APC (Pa)" mean adjusted values of oxygen partial pressure during film formation, and for example in the case of Al2O3-A, it is shown that the oxygen partial pressure was set to 2.00×10$^{-2}$ Pa. The columns "rate (angstrom/sec)" mean film formation rates. Note that, although not shown in Table 1, a degree of vacuum at the start of film formation was 2.0×10$^{-3}$ Pa, and the substrate was not heated in film formation.

The columns "IAD" show the conditions for ion assist, the "Voltage (V)" means the beam voltage of the ion gun 56, the "Current (mA)" means the beam current of the ion gun 56, and the "Acc (V)" means the acceleration voltage. The "O2 (GAS1) (SCCM)", the "Ar (GAS2) (SCCM)" and the "Ar (GAS3) (SCCM)" represent flow rates for supplying oxygen and argon. Here, the Ar (GAS2) represents a rate of supplying the argon gas components to the ion gun 56, and the Ar (GAS3) represents a rate of supplying the argon gas to the neutralization gun 57. Note that, for the materials "Al1O3-A", "Al1O3-B", "SiO2" and "Ag", film formation by the ion assistance was not carried out, and thus the values in the "IAD" columns are blank.

The refractive indices of the films obtained from the above "Al2O3-A" to "Al2O3-F" were 1.5768, 1.5763, 1.588, 1.576, 1.5897 and 1.6102 respectively. In other words, the refractive index of the aluminum oxide layer using the ion-assisted method is within a range 1 to 1.025 times of the refractive index in the case that the film is formed without using the ion-assisted method.

The following Table 2 explains the film structures of the reflection films in Examples 1 to 10 and Comparative Examples 1 to 4, and the following Table 3 summarizes the film thicknesses of the film elements constituting the reflection films in Examples and Comparative Examples.

TABLE 2

Constitution of the reflection film

| Layer number | Example 1 | Example 2 | Example 3 | Example 4 | Example 5 | Example 6 | Example 7 | Example 8 |
|---|---|---|---|---|---|---|---|---|
| 8 | | | | | | SiO2 | SiO2 | SiO2 |
| 7 | SiO2 | SiO2 | | | | H4 | H4 | H4 |
| 6 | H4 | H4 | SiO2 | SiO2 | SiO2 | SiO2 | SiO2 | SiO2 |
| 5 | Al2O3-E | Al2O3-E | H4 | H4 | H4 | H4 | H4 | H4 |
| 4 | Al2O3-B | Al2O3-B | Al2O3-E | Al2O3-E | Al2O3-E | Al2O3-B | Al2O3-B | Al2O3-B |
| 3 | Ag | Ag | Ag | Ag | Ag | Ag | Ag | Ag |
| 2 | H4 | H4 | H4 | H4 | H4 | H4 | H4 | H4 |
| 1 | Al2O3-D //PC// | Al2O3-E //PC// | Al2O3-C //PC// | Al2O3-D //PC// | Al2O3-E //PC// | Al2O3-C //PC// | Al2O3-D //PC// | Al2O3-E //PC// |

| Layer number | Example 9 | Example 10 | Comparative Example 1 | Comparative Example 2 | Comparative Example 3 | Comparative Example 4 |
|---|---|---|---|---|---|---|
| 8 | SiO2 | SiO2 | | | | |
| 7 | H4 | H4 | | | SiO2 | |
| 6 | SiO2 | SiO2 | SiO2 | SiO2 | H4 | SiO2 |
| 5 | H4 | H4 | H4 | H4 | Al2O3-E | H4 |
| 4 | Al2O3-B | Al2O3-B | Al2O3-B | Al2O3-B | Al2O3-B | Al2O3-F |
| 3 | Ag—Bi (1%) | Ag—Bi (0.25%) | Ag | Ag | Ag | Ag |
| 2 | H4 | H4 | H4 | H4 | H4 | H4 |
| 1 | Al2O3-E //PC// | Al2O3-E //PC// | Al2O3-A //PC// | Al2O3-C //PC// | Al2O3-C //PC// | Al2O3-F //PC// |

TABLE 3

Film thickness of each layer

| Layer number | Example 1 | Example 2 | Example 3 | Example 4 | Example 5 | Example 6 | Example 7 | Example 8 | Example 9 | Example 10 | Comparative Example 1 | Comparative Example 2 | Comparative Example 3 | Comparative Example 4 |
|---|---|---|---|---|---|---|---|---|---|---|---|---|---|---|
| 8 | | | | | | 30 | 30 | 30 | 30 | 30 | | | | |
| 7 | 30 | 30 | | | | 80 | 80 | 80 | 80 | 80 | | | 30 | |
| 6 | 80 | 80 | 30 | 30 | 30 | 20 | 20 | 20 | 20 | 20 | 30 | 30 | 75 | 30 |
| 5 | 60 | 60 | 80 | 80 | 80 | 75 | 75 | 75 | 75 | 75 | 75 | 75 | 60 | 75 |
| 4 | 60 | 60 | 120 | 120 | 120 | 35 | 35 | 35 | 35 | 35 | 120 | 120 | 60 | 120 |
| 3 | 60 | 60 | 60 | 60 | 60 | 60 | 60 | 60 | 60 | 60 | 60 | 60 | 60 | 60 |
| 2 | 60 | 60 | 60 | 60 | 60 | 40 | 40 | 40 | 40 | 40 | 60 | 60 | 60 | 60 |
| 1 | 55 | 55 | 55 | 55 | 55 | 60 | 60 | 60 | 60 | 60 | 55 | 55 | 55 | 55 |
| | //PC// | //PC// | //PC// | //PC// | //PC// | //PC// | //PC// | //PC// | //PC// | //PC// | //PC// | //PC// | //PC// | //PC// |

In Tables 2 and 3, the numbers of the layers mean the order of the layers from the substrate. Note that, the substrate is basically made of polycarbonate (PC), but in a case of a measurement substrate for measuring film stress (test piece), it may be made of glass material D263.

The following Table 4 summarizes the results of the environmental resistance test for the silver reflectors in Examples 1 to 10 and Comparative Examples 1 to 4.

were included in the evaluation items. That is, regarding the above-described crack and film peeling, a case that both were acceptable was marked with circle or "○", a case that relatively shallow cracks with depths of several millimeters or less were generated was marked with triangle or "Δ", and a case that even one of crack and film peeling was inacceptable was marked with cross or "X", for evaluation. Note that, regarding the crack, a case that no crack was confirmed

TABLE 4

Environmental test

| | | Example 1 | Example 2 | Example 3 | Example 4 | Example 5 | Example 6 | Example 7 | Example 8 |
|---|---|---|---|---|---|---|---|---|---|
| 85° C. DRY-1000H | Appearance determination | ○ | ○ | ○ | ○ | ○ | ○ | ○ | ○ |
| | Reflectance | ○ | ○ | ○ | ○ | ○ | ○ | ○ | ○ |
| 110° C. DRY-1000H | Appearance determination | Δ | Δ | Δ | Δ | Δ | ○ | ○ | ○ |
| | Reflectance | ○ | ○ | ○ | ○ | ○ | ○ | ○ | ○ |
| 85° C. 85%-1000H | Appearance determination | ○ | ○ | ○ | ○ | ○ | ○ | ○ | ○ |
| | Tape test | ○ | ○ | ○ | ○ | ○ | ○ | ○ | ○ |
| | Reflectance | ○ | ○ | ○ | ○ | ○ | ○ | ○ | ○ |

| | | Example 9 | Example 10 | Comparative Example 1 | Comparative Example 2 | Comparative Example 3 | Comparative Example 4 |
|---|---|---|---|---|---|---|---|
| 85° C. DRY-1000H | Appearance determination | ○ | ○ | ○ | ○ | ○ | ○ |
| | Reflectance | ○ | ○ | ○ | ○ | ○ | ○ |
| 110° C. DRY-1000H | Appearance determination | ○ | ○ | Δ | Δ | Δ | ○ |
| | Reflectance | ○ | ○ | ○ | ○ | ○ | ○ |
| 85° C. 85%-1000H | Appearance determination | ○ | ○ | X | X | X | Δ |
| | Tape test | ○ | ○ | ○ | ○ | ○ | X |
| | Reflectance | ○ | ○ | X | ○ | ○ | ○ |

In Table 4, the "85° C. DRY-1000H" means preservation under a hot and dry environment at an ambient temperature of 85° C. and a humidity of approximately zero for 1000 hours, the "110° C. DRY-1000H" means preservation under a hot and dry environment at an ambient temperature of 110° C. and a humidity of approximately zero for 1000 hours, and the "85° C. 85%-1000H" means preservation under a hot and humid environment at an ambient temperature of 85° C. and a relative humidity of 85% RH for 1000 hours.

The "appearance determination" is the result of the appearance measurement, wherein visual observation under a fluorescent lamp, normal stereomicroscopic observation, and microscope observation at 1000-fold magnification by VHX 2000 manufactured by KEYENCE CORPORATION were carried out. Although types of appearance defects include crack, film peeling, fogging and discoloration as main evaluation items, the fogging and discoloration were excluded from the subjects because of the differences depending on reflectance, and the crack and film peeling by visual observation under a fluorescent lamp was rated as acceptable. Regarding the film peeling, a case that 30 or less of circular peeling portions with diameters of about 100 µm are present in a ⌀30 mm silver reflector is rated as acceptable. As a form of film peeling, besides the circular film peeling, there is a string-like film peeling as observed in an ordinary vapor-deposited film, and this is also rated as inacceptable. These acceptance criteria for the appearance are within a range that problems of optical performance are not observed in actual measurement evaluation on products incorporating the silver reflector, and they are considered to be sufficiently within a range of acceptance or application also as criteria used for the general reflection optical system.

The "reflectance" is the result of reflectance measurement, and the polarization P reflected at 45 degrees in a bandwidth at a wavelength of 870 nm±30 nm was measured by using a spectrophotometer MCPD 3000 manufactured by Otsuka Electronics Co., Ltd. The piece is shaped to match the form for incorporating the silver reflector into the product. In the reflectance measurement, a case showing a reflectance of 95% or higher as a whole within the bandwidth was rated as circle or "○", and a case showing a reflectance of lower than 95% was rated as cross or "X". The numerical value 95% is assumed for a reflection optical system as a form to be incorporated into the products, and is a value that can be sufficiently accepted as optical performance for the intended products. Also in general, the reflector using silver has an extremely high reflectance, and the value 95% is a satisfactory value.

The "tape test" is an experiment in which a tape equipped with an adhesive face is temporarily adhered to a reflection film and then removed. A case that the reflection film was not peeled and maintained was rated as circle or "○", and a case that the reflection film was peeled was rated as cross or "X".

cable levels (triangle). Note that, Comparative Examples 1 to 4 were also rated as acceptable (circle) or as practically impeccable levels (triangle).

In judgement of appearance and reflectance after the hot and humid test of the "85° C. 85%-1000H" and judgment of a tape test, all of Examples 1 to 10 were acceptable (circle). On the other hand, Comparative Example 1 had problems in judgement results of appearance and reflectance (cross), Comparative Examples 2 and 3 had problems in judgement results of appearance (cross), and Comparative Example 4 had problems in results of the tape test (cross).

The following Table 5 summarizes the results of the film stress test for the silver reflectors in Examples 1 to 10 and Comparative Examples 1 to 4.

TABLE 5

Film stress

| | | Example 1 | Example 2 | Example 3 | Example 4 | Example 5 | Example 6 | Example 7 | Example 8 |
|---|---|---|---|---|---|---|---|---|---|
| Adhesion layer | One week | −29 | −55 | −32 | −29 | −55 | −32 | −29 | −55 |
| Al2O3 single | 110° C. 24 H | 55 | 3 | 102 | 55 | 3 | 102 | 55 | 3 |
| layer | 85° C. 85% 24 H | −82 | −70 | −69 | −82 | −70 | −69 | −82 | −70 |
| | Difference amount | 137 | 73 | 171 | 137 | 73 | 171 | 137 | 73 |
| Adhesion layer | One week | −182 | ← | ← | ← | ← | ← | ← | ← |
| H4 single layer | 110° C. 24 H | −214 | ← | ← | ← | ← | ← | ← | ← |
| | 85° C. 85% 24 H | −186 | ← | ← | ← | ← | ← | ← | ← |
| | Difference amount | −29 | ← | ← | ← | ← | ← | ← | ← |
| enhanc | One week | −16 | −16 | −39 | −39 | −39 | −77 | −77 | −77 |
| (multilayer) | 110° C. 24 H | 51 | 51 | −18 | −18 | −18 | −69 | −69 | −69 |
| | 85° C. 85% 24 H | −65 | −65 | −5 | −5 | −5 | −127 | −127 | −127 |
| | Difference amount | 116 | 116 | −13 | −13 | −13 | 58 | 58 | 58 |
| Total | One week | −1 | 11 | −4 | −2 | −9 | 2 | −13 | −20 |
| | 110° C. 24 H | 42 | 26 | 13 | 31 | 7 | −30 | −34 | −39 |
| | 85° C. 85% 24 H | 24 | 32 | −4 | 19 | 11 | −61 | −36 | −44 |
| | Difference amount | 18 | −6 | 16 | 12 | −3 | 30 | 2 | 5 |

| | | Example 9 | Example 10 | Comparative Example 1 | Comparative Example 2 | Comparative Example 3 | Comparative Example 4 |
|---|---|---|---|---|---|---|---|
| Adhesion layer | One week | −55 | −55 | 28 | −32 | −32 | −239 |
| Al2O3 single | 110° C. 24 H | 3 | 3 | 104 | 102 | 102 | −253 |
| layer | 85° C. 85% 24 H | −70 | −70 | −7 | −69 | −69 | −154 |
| | Difference amount | 73 | 73 | 111 | 171 | 171 | −99 |
| Adhesion layer | One week | ← | ← | ← | ← | ← | ← |
| H4 single layer | 110° C. 24 H | ← | ← | ← | ← | ← | ← |
| | 85° C. 85% 24 H | ← | ← | ← | ← | ← | ← |
| | Difference amount | ← | ← | ← | ← | ← | ← |
| enhanc | One week | −77 | −77 | −16 | −16 | −16 | Not measured |
| (multilayer) | 110° C. 24 H | −69 | −69 | 103 | 103 | 51 | Not measured |
| | 85° C. 85% 24 H | −127 | −127 | −36 | −36 | −65 | Not measured |
| | Difference amount | 58 | 58 | 139 | 139 | 116 | Not measured |
| Total | One week | −20 | −20 | 14 | 10 | 2 | −111 |
| | 110° C. 24 H | −39 | −39 | 104 | 86 | 40 | −105 |
| | 85° C. 85% 24 H | −44 | −44 | −22 | −12 | −5 | −92 |
| | Difference amount | 5 | 5 | 126 | 99 | 45 | −13 |

In judgement of the appearance and reflectance after the hot and dry test of the "85° C. DRY 1000H", all of not only Examples 1 to 10 but also Comparative Example 1 to 4 were rated as acceptable (circle).

Further, in judgement of the appearance and reflectance after the hot and dry test of the "110° C. DRY-1000H", Examples 6 to 10 were rated as acceptable (circle) without problem, and Examples 1 to 5 showing shallow cracks with depths of several millimeters or less, were practically impec- For reference, the results of the film stress test for each layer (see Table 1) constituting Examples of the reflection film 30 are summarized in Table 6. For example, the aluminum oxide films "Al1O3-A" to "Al1O3-F" constitute the first layer 31a of the adhesion layer 31 and the first layer 33f of the reflection-enhancing layer 33 in Examples and Comparative Examples.

TABLE 6

Single film stress

| | Material condition | | | | | | | | |
|---|---|---|---|---|---|---|---|---|---|
| | Al2O3-A | Al2O3-B | Al2O3-C | Al2O3-D | Al2O3-E | Al2O3-F | H4 | SiO2 | Ag |
| One week | 28 | 21 | −32 | −29 | −55 | −239 | 43 | −182 | 25 |
| 110° C. 24 H | 104 | 113 | 102 | 55 | 3 | −253 | 148 | −214 | 70 |
| 85° C. 85% 24 H | −7 | −29 | −69 | −82 | −70 | −154 | 117 | −115 | 50 |
| Difference amount | 111 | 141 | 171 | 137 | 73 | −99 | 31 | −99 | 20 |

In Table 5, the first column shows the results of testing the environmental change of the film stress (unit: "MPa") in the case that $Al_2O_3$ of the first layer constituting the adhesion layer is formed in a single layer state on the substrate. First, in the first step ("one week"), the test piece was left at room temperature for one week to stabilize the state of the film. Next, in the second step ("110° C. 24H"), the test piece was preserved under a hot and dry environment at an ambient temperature of 110° C. and a humidity of approximately zero for 24 hours to temporarily dry the reflection film. Finally, in the third step ("85° C. 85% 24H"), the test piece was preserved under a hot and humid environment at an ambient temperature of 85° C. and a humidity of 85% for 24 hours to humidify the reflection film. The column "difference amount" is a value obtained by subtracting the film stress after the treatment of "85° C. 85% 24H" from the film stress after the treatment of "110° C. 24H". This difference amount is obtained by inverting the symbol of the change amount of the film stress. That is, in the case of Example 1, by switching from the hot and dry environment for 24 hours to the hot and humid environment for 24 hours, the film stress of the first layer in the adhesion layer is decreased by only 137 MPa, and the change amount of the film stress corresponds to the negative (compressive stress) direction.

In Table 5, the second column shows the results of testing the environmental change of the film stress (unit: "MPa") in the case that $LaTiO_3$ (H4) of the second layer constituting the adhesion layer is formed in a single layer state on the substrate. Meanings of the "one week" (first step), the "110° C. 24H" (second step), the "85° C. 85% 24H" (third step) and the "difference amount" are the same as those in the first column. Note that, in the case of Example 1, by switching from the hot and dry environment for 24 hours to the hot and humid environment for 24 hours, the film stress of the second layer in the adhesion layer is increased by only 29 MPa, and the change amount of the film stress corresponds to the positive (tensile stress) direction. Note that, the arrow in the table means the same value as in the left column.

The third column shows the results of testing the environmental change of the film stress (unit: "MPa") in the case that only the reflection-enhancing layer (composed of $Al_2O_3$, $LaTiO_3$ (H4) and $SiO_2$) is formed in a multilayer state on the substrate. Meanings of the "one week" (first step), the "110° C. 24H" (second step), the "85° C. 85% 24H" (third step) and the "difference amount" are the same as those in the first column. Note that, in the case of Example 1, by switching from the hot and dry environment for 24 hours to the hot and humid environment for 24 hours, the film stress of the reflection-enhancing layer is decreased by only 116 MPa, and the change amount of the film stress corresponds to the negative (compressive stress) direction.

The fourth column shows the results of testing the environmental change of the film stress (unit: "MPa") in the case that the whole reflection film is formed in a multilayer state on the substrate. Meanings of the "one week" (first step), the "110° C. 24H" (second step), the "85° C. 85% 24H" (third step) and the "difference amount" are the same as those in the first column. Note that, in the case of Example 1, by switching from the hot and dry environment for 24 hours to the hot and humid environment for 24 hours, the whole film stress is decreased by only 18 MPa, and the change amount of the film stress corresponds to the negative (compressive stress) direction.

Regarding the results of stress measurement described above, in the "one week" (first step), the "110° C. 24H" (second step) and the "85° C. 85% 24H" (third step), the film stress of 100 MPa or lower is an acceptance criterion. This is because the PV value of the optical surface exceeds an acceptable range of the optical performance e.g. when the film stress for the assumed product exceeds 100 MPa. For example, when a film is formed on one side of a 040 mm polycarbonate with a thickness of 3 mm as in Example, a deformation amount due to the film stress of 100 MPa is about 1 μm. Since this deformation amount varies depending on the thickness and the material of the substrate, the acceptable range depends on the product. However, it is natural that, as a general optical system, the film stress had better be as small as possible, and at least for the mirror used for the precise reflection optical system, it is considered that the film stress is preferably adjusted to 100 MPa or lower.

Note that, it is desirable that the film stress is relatively low, not only when the whole reflection film is formed as in the fourth column but also when a part of the reflection film is formed as in the first to third columns.

To summarize the results of the film stress test, regarding the state one week after the film formation, in Examples 1 to 10 and Comparative Examples 1 to 3, the stress value of the whole reflection film was close to 0, resulting in a film with reduced face deformation. On the other hand, regarding Comparative Example 4, the film stress was extremely high, and the stress value generated concern about face deformation. This is attributed to the fact that the film-forming condition of the $Al_2O_3$ for enhancing reflection in Comparative Example 4 included use of a strong ion assistance.

As for the change after the film was subjected to the "110° C. 24H" (second step), it was found that the film stresses in Examples 1 to 5 changed to a positive direction and the film stresses in Examples 6 to 10 changed to a negative direction, compared to the state one week after the film formation. This result seems to be remarkably influenced by the reflection-enhancing layer, and particularly in Examples 6 to 10, it may be determined that this result was considerably influenced by the film stress from $LaTiO_3$ (H4) because of the thin film thickness of $Al_2O_3$ used in the reflection-enhancing layer.

As for the change after the film was subjected to the "85° C. 85% 24H" (third step), it was found that the film stresses in Examples 1, 3, 4, 6 to 10 changed to a negative direction and the film stresses in Examples 2 and 5 changed to a positive direction, compared to the "110° C. 24H" (second step). This may be attributed to the influence of the film-forming condition for the $Al_2O_3$ as the first layer in the adhesion layer. Here, the reason why Examples 8 to 10 under the same conditions regarding the adhesion layer as in Examples 2 and 5 did not change to the positive direction is because of the influence of the layer constitutions of the reflection-enhancing films used in Examples 8 to 10 different from those in Examples 2 and 5.

According to the difference amount between the above-described "110° C. 24H" (second step) and "85° C. 85% 24H" (third step), the film stresses in Examples 1 to 10 were found to be 40 MPa or lower in absolute value. On the other hand, the film stresses in Comparative Examples 1 to 3 were 40 MPa or higher. Here, the state that the difference amounts of the film stresses in Examples 1 to 10 are 40 MPa in absolute value means that when the film stress changes to the negative direction (compressive stress side), its change amount is 40 MPa or lower in absolute value, and when the film stress changes to the positive direction (tensile stress side), its change amount is 40 MPa or lower in absolute value. Note that, although the difference amount of the film stress in Comparative Example 4 is 40 MPa or lower in absolute value, the original film stress is extremely high, resulting in concern about face deformation.

Considering from the above results, it was found that the film stress after the 110° C. 24H treatment in which the film was preserved under a hot and dry condition for 1 day and the film stress after the 85° C. 85% 24H treatment in which the film was preserved under a hot and humid condition for 1 day changed in complex association with each other at a multilayer level, and a state of a layer structure where the change was small was achieved so that film deterioration due to the environmental change could be prevented.

Although the prior art described the denseness of the layer and the material composition, it was found that reducing the stress against the environmental change was an important condition for obtaining a good reflection film even if using the same material. Meanwhile, it was also found that if strong ion assistance was partially used as Comparative Example 4, the change amount of the film stress decreased and the environmental resistance was improved, but the film stress became too strong and face deformation was caused. In other words, in order to obtain a reflection film in which peeling and decrease of reflectance were reduced while suppressing the face deformation, it was turned out that meeting each of the following conditions was important: (1) the film stress after film formation of the reflection film is within a range of +100 MPa to −100 MPa; and (2) the absolute value of the change amount between the film stress value after the film is subjected to a hot and dry environment at 110° C. for 24 hours and the film stress value after the film is subjected to a hot and humid environment at 85° C. and 85% RH for 24 hours is 40 MPa or lower. Furthermore, it is also important that (3) the film stress after the reflection film is subjected to a hot and dry environment at 110° C. for 24 hours is within a range of +100 MPa to −100 MPa, and (4) the film stress after the reflection film subjected to a hot and dry environment at 110° C. is subjected to a hot and humid environment at 85° C. and 85% RH for 24 hours is within a range of +100 MPa to −100 MPa.

Here, the key points of the present invention of this patent application will be explained. For example, in the above-described Patent Literature 2, there was described that an effect of improving environmental resistance was secured by sandwiching a silver film from both sides with aluminum oxide having high denseness, and adhesiveness was secured while valancing the stresses for the upper layers such as $TiO_2$ and $SiO_2$ formed on the sandwiched layer. However, as a result of examination by the inventors of this patent application, it was revealed that these were not enough when a silver mirror with higher reliability was required.

The inventors of this patent application analyzed various prototypes from the viewpoint of behavior of the film stress against the environmental change and uncovered that a highly reliable silver mirror was a mirror not only having the general layer constitutions of composition, film thickness, film density and the like but also showing little change in the film stress under a hot and dry condition and a hot and humid condition, in consideration of the state change in a single layer state and a multilayer state. That is, the inventors of this patent application could establish a method for selecting an extremely reliable silver mirror by assessing the balance of the layer constitution in which change in the film stress under the hot and dry condition and the hot and humid condition was decreased and by determining a quantitative value of this change amount.

As described above, the silver reflector according to the present invention, or the manufacture method and examination method therefor have been described in accordance with the embodiments or Examples, but the silver reflector and the like according to the present invention are not limited to the above-described specific examples.

For example, a film mainly composed of aluminum oxide constituting the adhesion layer 31 and the like can be formed not only by vapor deposition according to the above-described ion-assisted method but also by other film-forming methods. Specifically, it can be formed by a sputtering method, an RF deposition method, an ion plating method, an ionized cluster beam deposition method, a plasma ion beam deposition method, and the like.

The invention claimed is:

1. A silver reflector comprising an adhesion layer as a primer layer, a main silver layer formed on the adhesion layer, and a reflection-enhancing layer formed on the main silver layer as a reflection film, wherein
    the main silver layer is formed of either silver or an alloy mainly composed of silver,
    a film stress after the reflection film is formed, is within a range of +100 MPa to −100 MPa,
    a film stress after the reflection film is subjected to a hot and dry environment at 110° C. for 24 hours, is within a range of +100 MPa to −100 MPa,
    a film stress after the reflection film subjected to the hot and dry environment at 110° C. is subjected to a hot and humid environment at 85° C. and 85% RH for 24 hours, is within a range of +100 MPa to −100 MPa, and
    an absolute value of a change amount between the film stress value after the film is subjected to the hot and dry environment at 110° C. for 24 hours and the film stress value after the film is subjected to the hot and humid environment at 85° C. and 85% RH for 24 hours, is 40 MPa or lower.

2. The silver reflector according to claim 1, wherein the adhesion layer includes at least one layer mainly composed of aluminum oxide, the layer mainly composed of aluminum oxide is formed by an ion-assisted method, and a film stress of the layer mainly composed of aluminum oxide is compressive stress.

3. The silver reflector according to claim 2, wherein the layer mainly composed of aluminum oxide has a refractive index of 1.55 to 1.65.

4. The silver reflector according to claim 1, wherein either the adhesion layer or the reflection-enhancing layer includes at least one adjustment layer, and a film stress of the adjustment layer, in a single layer state, after the layer is subjected to a hot and humid environment at 85° C. and 85% RH for 24 hours is changed to a negative direction relative to a film stress after the layer is subjected to a hot and dry environment at 110° C. for 24 hours.

5. The silver reflector according to claim 1, wherein either the adhesion layer or the reflection-enhancing layer includes at least one adjustment layer, and a film stress of the adjustment layer, in a single layer state, after the layer is subjected to a hot and humid environment at 85° C. and 85% RH for 24 hours is changed to a positive direction relative to a film stress after the layer is subjected to a hot and dry environment at 110° C. for 24 hours.

6. The silver reflector according to claim 1, wherein an additive material of the alloy mainly composed of the silver is any of Bi, Pd, Cu, Au, Ge, Nd and Al.

7. The silver reflector according to claim 1, wherein the adhesion layer includes at least two layers, and a material for each layer constituting the adhesion layer is at least one selected from: a material mainly composed of aluminum oxide, $LaTiO_3$, $CeO_2$, $Y_2O_3$, and $SnO_2$.

8. The silver reflector according to claim 7, wherein a material of a layer directly adhering to the main silver layer among the adhesion layer is at least one selected from $LaTiO_3$, $CeO_2$, $Y_2O_3$ and $SnO_2$.

9. The silver reflector according to claim 1, wherein the reflection-enhancing layer includes at least three layers, and a layer directly adhering to the main silver layer in the reflection-enhancing layer is formed of the material mainly composed of aluminum oxide.

10. The silver reflector according to claim 1, wherein the film stress of the reflection-enhancing layer is more than −50 MPa in the negative direction.

11. The silver reflector according to claim 1, wherein the reflection-enhancing layer includes three or more layers, and has a structure that a high-refractive index material layer and a low-refractive index material layer are alternately laminated on a layer formed of a material mainly composed of aluminum oxide and adhering to the main silver layer, wherein the high-refractive index material is at least one selected from $TiO_2$, $Nb_2O_5$, $Ta_2O_5$, $LaTiO_3$, $ZrO_2$ and a mixed material of these materials, and the low-refractive index material is at least one selected from $SiO_2$ and a mixed material prepared by mixing $SiO_2$ with aluminum oxide.

12. An examination method for a silver reflector comprising an adhesion layer as a primer layer, a main silver layer formed on the adhesion layer and a reflection-enhancing layer formed on the main silver layer as a reflection film, wherein
the main silver layer is formed of either silver or an alloy mainly composed of silver,
it is judged whether or not a film stress after the reflection film is formed is within a range of +100 MPa to −100 MPa, and
it is judged whether or not an absolute value of a change amount between a film stress value after the reflection film is subjected to a hot and dry environment at 110° C. for 24 hours and a film stress value after the reflection film subjected to the hot and dry environment at 110° C. for 24 hours is subjected to a hot and humid environment at 85° C. and 85% RH for 24 hours, is 40 MPa or lower.

13. The examination method for the silver reflector according to claim 12, wherein
it is judged whether or not the film stress after the reflection film is subjected to the hot and dry environment at 110° C. for 24 hours is within a range of +100 MPa to −100 MPa, and
it is judged whether or not the film stress after the reflection film subjected to the hot and dry environment at 110° C. is subjected to the hot and humid environment at 85° C. and 85% RH for 24 hours is within a range of +100 MPa to −100 MPa.

14. The examination method for the silver reflector according to claim 13, wherein
it is judged whether or not a film stress of a layer mainly composed of aluminum oxide is a compressive stress when the adhesion layer includes the layer mainly composed of aluminum oxide formed by using the ion-assisted method.

15. An manufacture method for a silver reflector comprising an adhesion layer as a primer layer, a main silver layer formed on the adhesion layer and a reflection-enhancing layer formed on the main silver layer as a reflection film, wherein
the main silver layer is formed of either silver or an alloy mainly composed of silver,
a film stress after the reflection film is formed, is within a range of +100 MPa to −100 MPa, and
an absolute value of a change amount between a film stress value after the reflection film is subjected to a hot and dry environment at 110° C. for 24 hours and a film stress value after the reflection film subjected to the hot and dry environment at 110° C. for 24 hours is subjected to a hot and humid environment at 85° C. and 85% RH for 24 hours, is 40 MPa or lower.

16. The manufacture method for the silver reflector according to claim 15, wherein a test piece having the same structure as in the silver reflector is prepared to measure the film stress.

* * * * *